(12) United States Patent
Singh et al.

(10) Patent No.: US 9,804,225 B2
(45) Date of Patent: Oct. 31, 2017

(54) SCHEME TO MEASURE INDIVIDUALLY RISE AND FALL DELAYS OF NON-INVERTING LOGIC CELLS

(71) Applicant: STMicroelectronics International N.V., Amsterdam (NL)

(72) Inventors: Saurabh Kumar Singh, Noida (IN); Balwant Singh, Greater Noida (IN)

(73) Assignee: STMICROELECTRONICS INTERNATIONAL N.V., Amsterdam (NL)

( * ) Notice: Subject to any disclaimer, the term of this patent is extended or adjusted under 35 U.S.C. 154(b) by 492 days.

(21) Appl. No.: 14/472,220

(22) Filed: Aug. 28, 2014

(65) Prior Publication Data

US 2016/0061894 A1    Mar. 3, 2016

(51) Int. Cl.
*G01R 31/28* (2006.01)
*G01R 31/317* (2006.01)

(52) U.S. Cl.
CPC ............... *G01R 31/31725* (2013.01)

(58) Field of Classification Search
CPC .................................. G01R 31/31725
See application file for complete search history.

(56) References Cited

U.S. PATENT DOCUMENTS

| 6,650,162 B2 | 11/2003 | Dubey |
| 2009/0051396 A1* | 2/2009 | Shimamoto ............ G01R 29/26 327/153 |
| 2010/0164476 A1* | 7/2010 | Molchanov ...... G01R 31/31725 324/76.82 |

\* cited by examiner

*Primary Examiner* — Thien D Nguyen
(74) *Attorney, Agent, or Firm* — Seed IP Law Group LLP (57) ABSTRACT

A test circuit measures both the rising edge delay and the falling edge delay associated with a logic cell. The test circuit includes a flip-flop type ring oscillator with two groups of logic cells connected in series in the oscillation path. A first multiplexor switches the ring oscillator between a rising edge and a falling edge mode. A second multiplexer causes the second group of logic cells to be included or excluded from the oscillation path. By measuring the oscillation period in the various modes, the rising edge and falling edge delays can be individually calculated.

15 Claims, 6 Drawing Sheets

SCHEME TO MEASURE INDIVIDUALLY RISE AND FALL DELAYS OF NON-INVERTING LOGIC CELLS

BACKGROUND

Technical Field

The present disclosure relates to the field of testing and characterization of signal propagation delay of logic cells. The present disclosure relates more particularly to the field of testing and characterization of the propagation delay of both rising edge signals and falling edge signals in logic cells.

Description of the Related Art

Digital integrated circuits typically include many different kinds of logic cells. Types of logic cells include OR gates, AND gates, NOR gates, NAND gates, inverters, buffers, and many other kinds of logic cells. Digital integrated circuits can include millions or even billions of transistors connected together in a complex organization to form the various circuits of the digital integrated circuit.

Logic cells commonly receive a signal on one or more inputs and output a signal in accordance with the inputs. For each kind of logic cell there is some delay from the time it takes after receiving an input signal to outputting the signal. For instance, if the output of an OR gate is low, after the OR gate receives a high signal on one of its inputs there is some delay before the output of the OR gate goes high. Likewise, if the output of the OR gate is high, after the OR gate receives low signals on all of its inputs there is some delay before the output of the OR gate goes low.

In order to properly design a digital integrated circuit, it is beneficial to know as nearly as possible the signal propagation delay of each kind of logic cell. Knowing the signal propagation delay caused by each kind of logic cell enables circuit designers to design more powerful and well-timed circuits.

Silicon qualification of logic cells is a vital element in the overall $\overline{Q}$silicon qualification of a technology platform. The signal propagation delay is an important parameter of a logic cell. Many methods have been used to measure the delay of logic cells in silicon. One such way is to make a ring oscillator that includes one or more logic cells in the oscillation path and to measure the frequency of the ring oscillator. The frequency of the ring oscillator gives an indication of the average of the rise and fall delay of all logic cells. In other words, there is a first kind of delay when the rising edge of the signal is received at the inputs of the logic cell. There is a second kind of delay when a falling edge of the logic signal is received at the inputs of the logic signal. Prior ring oscillator methods for measuring the delay of logic cells have only provided an average of both the rise and fall delay of the logic cells.

As integrated circuit technology becomes more complex and the structures in the integrated circuit become smaller and more densely arranged, it is becoming increasingly more beneficial to know both the rising and the falling delays of a logic cell in order to more nearly correlate CAD designs with the actual circuits implemented in the integrated circuit die.

BRIEF SUMMARY

One embodiment is a logic cell delay test and characterization circuit that includes a flip-flop type ring oscillator with a plurality of logic cells arranged in series in the oscillation path. A switch is coupled between the output of the flip-flop and the logic cells. The output of the string of logic cells is connected in a feedback configuration to the flip-flop so that an input signal to the flip-flop will cause oscillation to begin.

When an input signal is fed to the flip-flop to start the oscillation, the output of the flip-flop goes from a low state to the high state. The switch supplies the rising edge signal from the output of the flip-flop to the logic cells. The rising edge signal propagates through the logic cells from the input of one logic cell to its output, and from its output to the input of the next logic cell until the rising edge signal has propagated through all of the logic cells. The output of the final logic cell is then fed back to the flip-flop which in the meantime has been reset, so that when the rising edge signal output from the final logic cell reaches the flip-flop, the flip-flop again outputs the rising edge signal. The period of the oscillation signal is based on the rising edge propagation delay of the chain of logic cells.

When the period of the oscillation signal has been measured, the logic cell delay test and characterization circuit enters a second rising edge delay test and characterization mode in which the rising edge propagation signal is passed through only a subset of the chain of logic cells. In other words, in the second mode, the oscillation path does not include all of the logic cells. Instead the oscillation path includes only a smaller subset of the logic cells. The period of the oscillation signal in the second mode is based on the rising edge propagation delay through the smaller subset of logic cells.

A control circuit associated with the logic cell delay test and characterization circuit measures the period of the ring oscillator circuit in the first mode and the period of the ring oscillator circuit in the second mode and subtracts the period of the second mode from the period of the first mode. The difference in the periods is the propagation delay of the rising edge signal through the number of logic cells corresponding to the difference between the logic cells included in the oscillation path in the first mode and the logic cells included in the oscillation path in the second mode. Thus, by dividing the difference in periods by the number corresponding to the difference in logic cells, the rising edge delay for a single logic cell can be accurately calculated.

When the delay of the falling edge signal is to be measured, the switch that is positioned between the output of the flip-flop and the chain of logic cells supplies a falling edge signal to the input of the chain of logic cells when the output of the flip-flop goes high. The falling edge delay measurement includes a first and second mode. In the first mode, the falling edge signal from the switch is propagated through the entire chain of logic cells and fed back to the input of the flip-flop. The period of the oscillator circuit in the first mode is measured. The logic cell delay test and characterization circuit then enters the second mode in which the falling edge signal propagates through only the smaller subset of the logic cells. The period of the oscillator circuits in the second mode is then measured. The difference between the period in the first mode and the period in the second mode is the total delay of the falling edge signal propagating through a number of logic cells equivalent to the difference between the total number of logic cells and the smaller subset of logic cells. Thus, by dividing the difference in the periods by the number corresponding to the difference in logic cells, the falling edge delay for a single logic cell can be accurately calculated.

A logic cell delay test and characterization circuit according to one embodiment can accurately calculate both the falling edge delay and the rising edge delay for a given type of logic cell.

DETAILED DESCRIPTION

Figure 1:
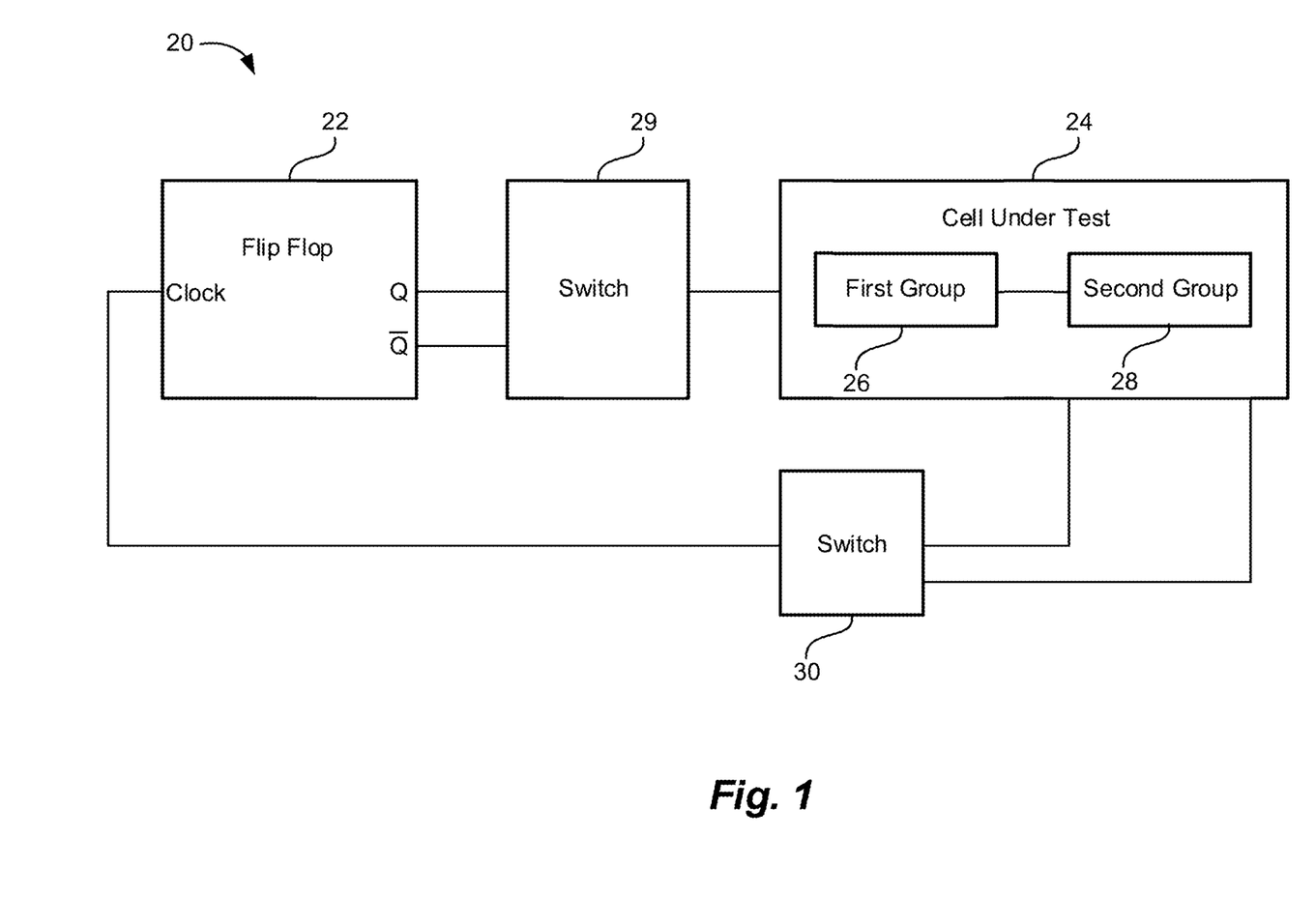
FIG. 1 is a block diagram of a logic cell test and characterization circuit according to one embodiment.

FIG. 1 is a block diagram of a logic cell delay test and characterization circuit according to one embodiment. The logic cell delay test and characterization circuit 20 includes a flip-flop 22, a chain of logic cells 24 including a first group 26 of logic cells and a second group 28 of logic cells coupled to the flip-flop 22 in a ring oscillator configuration. A first switch 29 is coupled between the output of the flip-flop 22 and the input of the cells under test 24. A second switch 30 is coupled between the output of the cells under test 24 and the input of the flip-flop 22.

The test and characterization circuit 20 of FIG. 1 makes advantageous use of a property of flip-flop type ring oscillators in which the frequency of flip-flop ring oscillators depends only on one type of signal transition, either the rising edge signal transition or the falling edge signal transition. The test and characterization circuit 20 uses the chain of logic cells under test 24 as a delay element in the flip-flop type ring oscillator structure. The more logic cells included in the cells under test 24, the lower the oscillation frequency of the flip-flop type ring oscillator.

The operation of the test and characterization circuit 20 will now be described. Before oscillation has begun, the primary output of the flip-flop 22 is at a logic low level. An enable signal is then provided to the input of the flip-flop 22. The output of the flip-flop 22 then goes to a high logic level. The rising edge signal of the transition from the low level to the high level at the output Q of the flip-flop 22 is passed from the switch 29 to the input of the cells under test 24. The flip-flop 22 is then reset via circuitry not shown in FIG. 1. In a first mode, the rising edge signal passes from the output of the first switch 29 to the input of the cells under test. The rising edge signal passes through the first group of logic cells 26 and the second group of logic cells 28. The rising edge signal passes from the output of the second group of logic cells 28 to the switch 30. The switch 30 supplies the rising edge signal from the output of the second group 28 to the input of the flip-flop 22. The rising edge signal from the switch 30 causes the output of the flip-flop 22 to again go high and the cycle repeats itself. In this way, an oscillating signal is generated as the output Q of the flip-flop 22 goes high when first enabled, and is quickly brought low again. The output of the flip-flop 22 is not brought high again until the rising edge signal from the output of the second group again reaches the input of the flip-flop.

Control circuitry, not shown, measures the oscillation frequency of the ring oscillator circuit in the first mode. The period of the oscillation signal is calculated from the oscillation frequency. The period is proportional to the delay caused by the cells under test 24.

After the period of the oscillation signal in the first mode has been calculated, the test and characterization circuit 20 enters a second mode. The operation of the ring oscillator circuit in the second mode is substantially similar to the operation of the ring oscillator circuit in the first mode. The primary difference is that in the second mode, the switch 30 couples the output of the first group 26 to the input of the flip-flop 22. In this way, the second group of logic cells 28 is bypassed in the oscillation path. Thus, only the rising edge signal delay due to the first group of logic cells 26 affects the oscillation frequency and the period of oscillation.

The control circuitry again measures the oscillation frequency of the ring oscillator in the second mode. The control circuitry then calculates the period of the oscillating signal.

The rising edge delay due to a single logic gate can be calculated based on the calculation of oscillation period in the first and the second mode. In particular, the delay due to a single logic gate can be calculated by subtracting the period of the second mode from the period of the first mode. This difference in periods between the first and the second mode is equal to the delay due to the number in the second group. The rising edge propagation delay due to a single logic gate is equal to the difference in periods divided by the number of logic cells in the second group 28. The control circuit calculates the delay in a single logic cell in this manner.

However, it is beneficial to know not only the rising edge propagation delay but the falling edge propagation delay as well. To this end, the test and characterization circuit 20 includes a falling edge delay calculation mode as well.

In the falling edge calculation mode, the switch 29 passes the logical opposite $\overline{Q}$ of the output Q to the input of the cells under test 24.

In the falling edge calculation mode, an enable signal is first passed to the clock input of the flip-flop 22. The output Q of the flip-flop 22 goes high when the enable signal is received at the clock input. The output $\overline{Q}$ of the flip-flop 22 goes low when the enable signal is received at the clock input of the flip-flop 22. In the falling edge calculation mode, the switch 29 passes the falling edge signal from $\overline{Q}$ to the input of the cells under test 24. A falling edge signal therefore propagates through the logic cells under test 24.

The falling edge calculation mode includes first and second modes as described previously with respect to the rising edge delay calculation mode above. In the first mode of the falling edge calculation the oscillation path includes all of the logic cells in the first group 26 and the second group 28. In other words, the switch 30 passes the signal from the output of the second group 28 to the clock input of the flip-flop 22. Thus the oscillation signal path includes all of the logic cells in the first and second groups 26, 28. Though not shown in FIG. 1, the switch 30 inverts the signal from the output of the second group 28 before passing it to the clock input of the flip-flop 22.

When the falling edge signal has propagated through the logic cells of the first and second group, through the switch 30, is inverted, and is received at the clock input of the flip-flop 22, the output Q of the flop 22 again goes high, while the output $\bar{Q}$ goes low. This happens because the flip-flop 22 is reset shortly after the clock input of the flip-flop 22 goes high. When $\bar{Q}$ goes low, a falling edge signal is again passed to the cells under test 24 and the cycle repeats itself. In this way, an oscillation signal is generated having a frequency based on the falling edge delay in the logic cells.

In the second mode of the falling edge calculation, the oscillation path includes only the logic cells in the first group 26. When the falling edge signal has propagated through the logic cells of the first group 26, through the switch 30, is inverted, and is received at the clock input of the flip-flop 22, the output Q of the flip-flop 22 again goes high, while the output $\bar{Q}$ goes low. This happens because the flip-flop 22 is reset shortly after the clock input of the flip-flop 22 goes high. When $\bar{Q}$ goes low, a falling edge signal is again passed to the cells under test 24 and the cycle repeats itself. In this way, an oscillation signal is generated having a frequency based on the falling edge delay in the logic cells of the first group 26. The control circuitry again measures the oscillation frequency of the ring oscillator in the second mode. The control circuitry then calculates the period of the oscillating signal.

The falling edge delay of a single logic gate can be calculated based on the calculation of period in the first and the second mode of the falling edge calculation mode. In particular, the delay due to a single logic gate can be calculated by subtracting the period of the second load from the period of the first mode. This difference in period between the first and the second modes is equal to the falling edge delay of the second group. The rising edge propagation delay due to a single logic gate is equal to the difference in periods in the first and second mode divided by the number of logic cells in the second group 28. The control circuit calculates the falling edge delay due to a single logic cell in this manner.

In one embodiment, the logic cell delay test and characterization circuit 20 is implemented in a dedicated integrated circuit die. The dedicated integrated circuit die includes the flip-flop 22, the switch 29, the cell under test 24, and the switch 30. When a new logic cell is designed, the rising edge and falling edge delay of the logic cell can be measured by forming a test and characterization circuit 20 in an integrated circuit die including a flip-flop ring oscillator with a plurality of the new logic cells as the cells under test 24 as shown in FIG. 1. In this manner, each time new logic cells are designed, or each time new measurements of the rising edge and falling edge delay are to be measured, the test and characterization circuit 20 can be formed in an integrated circuit die and the measurements be made.

Figure 2:
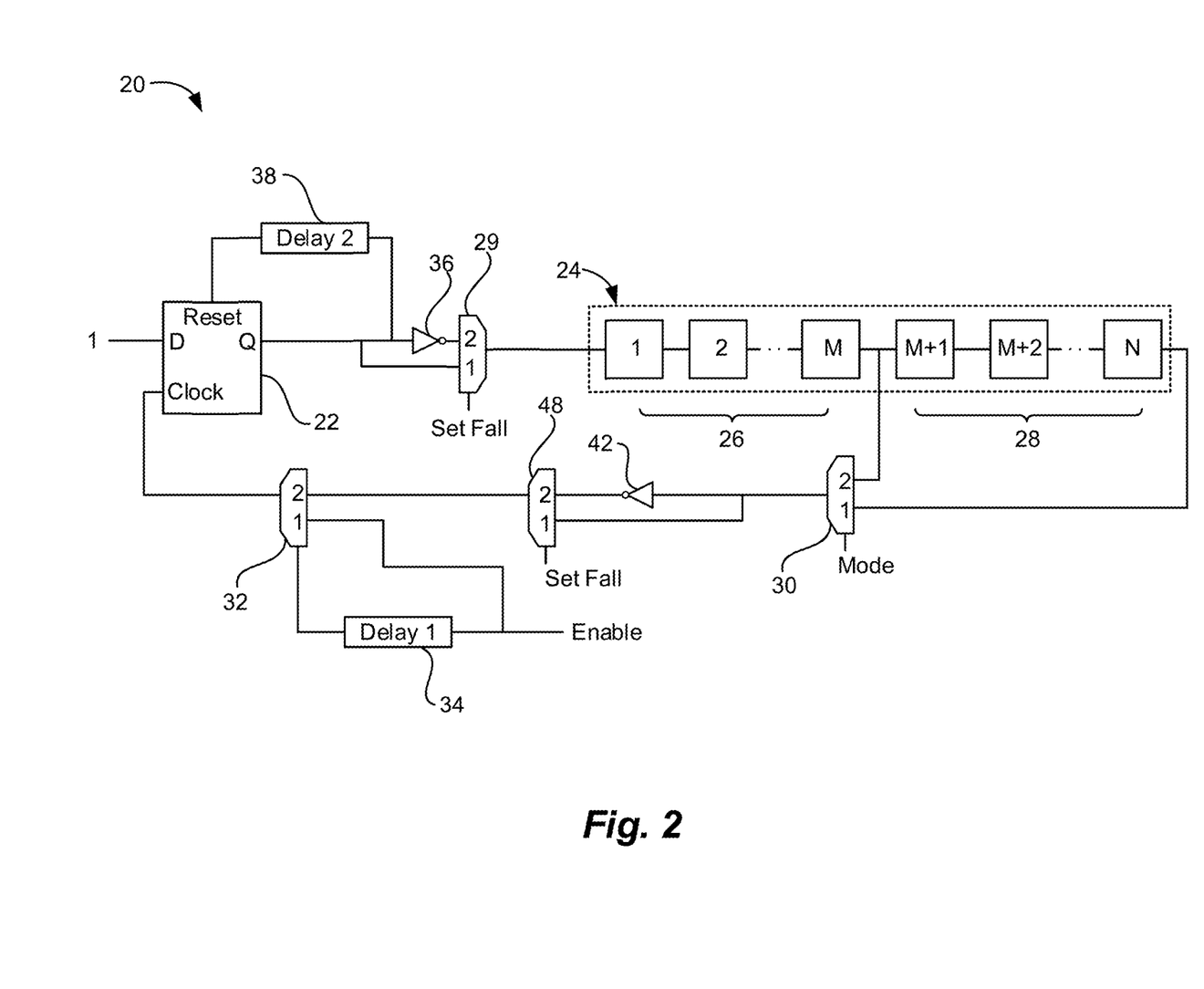
FIG. 2 is a simplified schematic diagram of a logic cell test and characterization circuit according to one embodiment.

FIG. 2 is a schematic diagram of a logic cell delay test and characterization circuit according to one embodiment. The test and characterization circuit 20 includes a flip-flop 22 having a data input D, a clock input Clock, and an output Q. A multiplexer 29 has a first input coupled directly to the output Q of the flip-flop 22, and a second input coupled to the output Q of the flip-flop 22 via an inverter 36. The multiplexer 29 receives a mode setting signal Set Fall that determines which of the multiplexer inputs is provided to the output of the multiplexer 29. A plurality of logic cells 24 are connected in series. A first logic cell 1 has an input connected to the output of the multiplexer 29. The output of the logic cell 1 is connected to the input of the logic cell 2 and so forth. Logic cells 24 are grouped in a first group 26 and a second group 28. Logic cells 1 through M are included in the first group 26. Logic cells M+1 through N are included in the second group 28. The chain of logic cells includes a first output corresponding to the output of the logic cell M, and a second output corresponding to the output of the final logic cell N. A second multiplexer 30 has a first input coupled to the output of the logic cell M and a second input coupled to the output of the logic cell N. The multiplexer 30 receives a mode setting signal Mode that determines which of the inputs is provided to the output of the multiplexer 30. A third multiplexer 48 has a first input coupled to the output of the multiplexer 30, and a second input coupled to the output of the multiplexer 30 via an inverter 42. The third multiplexer 48 receives the mode select signal Set Fall that determines which of the inputs is provided to the outputs of the multiplexer 48. A fourth multiplexer 32 has a first input connected to the output of the multiplexer 48, and a second input that receives an enable signal Enable. The enable signal Enable is also provided to a mode setting input of the multiplexer 32 via a delay element 34. The output of the multiplexer 32 is coupled to the clock input Clock of the flip-flop 22.

The delay test and characterization circuit 20 is a flip-flop type ring oscillator circuit that generates an oscillating signal having a frequency that depends on either the rising edge delay in the logic cells 24 or the falling edge delay in the logic cells 24 depending on the value of the mode setting signal Set Fall. Furthermore, the oscillating frequency depends on whether the oscillation path includes only the first group 26 of logic cells 24 or both the first group 26 and the second group 28 of logic cells 24. The mode setting signal Mode determines whether the oscillation path includes both the first group 26 and the second group 28 or only the first group 26. Thus, the delay test and characterization circuit 20 can generate an oscillating signal that has four possible frequencies, two frequencies in each of the rising edge mode and falling edge mode. Measuring each of the four frequencies, or the periods corresponding to each of the four frequencies, allows a measurement of both the rising edge delay of the logic cells 24 and the falling edge delay of the logic cells 24.

Operation of the test and characterization circuit 20 will now be described beginning with measuring the rising edge delay of the logic cells 24. When the rising edge delay of the logic cells 24 is to be measured, the value of Set Fall is low, thereby selecting input 1 of both the multiplexer 29 and the multiplexer 48. In a first mode of the rising edge delay measurement the signal Mode is low, thereby selecting input 1 of the multiplexer 30 and including both the first group 26 and the second group 28 of logic cells 24 in the oscillation path.

The data input D of the flip-flop 22 always receives a high signal when delay measurement are to be made. When oscillation signals are to be made, the enable signal Enable goes high. The enable signal Enable is supplied directly to the input 1 of the multiplexer 32. When Enable initially goes high, input 1 is selected because the high Enable signal has not yet propagated through the delay element 34 and the selection input is therefore low until the Enable signal propagates through the delay element 34. Thus, when Enable goes high the high signal is output from the multiplexer 32 to the clock input Clock of the flip-flop 22.

When the clock input Clock receives the high enable signal the output Q goes high. The rising edge of the high signal of the output Q is provided directly to input 1 of the multiplexer 29. The logical opposite of Q is provided via the inverter 36 to input 2 of the multiplexer 29. Because Set Fall is low (corresponding to selection of the rising edge delay mode), input 1 of the multiplexer 29 is selected and the rising edge signal from Q is output to the input of the logic cell 1.

It is beneficial at this point to describe the function of the delay elements 34, 38 prior to further discussion of the rising edge signal propagation through the logic cells 24. Shortly after Enable goes high, the high Enable signal propagates through the delay element 34 to the selection input of the multiplexer 32. When the high Enable signal reaches the selection input of the multiplexer 32, the input 2 of the multiplexer 32 is selected and a low signal is supplied from the input 2 of the multiplexer 32 (because the multiplexer 48 initially outputs a low signal to input 2 of the multiplexer 32) to the clock input Clock of the flip-flop 22. Likewise, after Q initially goes high, the high signal propagates through the delay element 38 to the Reset input of the flip-flop 22, thereby resetting the output Q of the flip-flop 22 to a low value. The delays caused by the delay element 38 and the delay element 34 are much smaller than the oscillation period of the ring oscillator, thereby ensuring that the output Q of the flip-flop 22 is reset to a low value before the rising edge signal again reaches the input Clock of the flip-flop 22 as will be described in more detail below.

The logic cell 1 receives the rising edge signal from the output of the multiplexer 29 and outputs the rising edge signal to the input of the logic cell 2. The logic cell 2 receives the rising edge signal from the output of the logic cell 1 and outputs the rising edge signal to the next logic cell and so forth until the logic cell M receives the rising edge signal and outputs the rising edge signal to logic cell M+1 of the second group 28. The rising edge signal is passed through the logic cells of the second group 28 until it is output from the final logic cell N of the second group 28 and passed to the input 1 of the multiplexer 30.

Because Mode is low, input 1 of the multiplexer 30 is selected. The rising edge signal is provided from the output of the multiplexer 30 to the input 1 of the multiplexor 48. The logical opposite of the output of the multiplexer 30 is provided to input 2 of the multiplexer 48 via the inverter 42. Because Set Fall is low, input 1 of the multiplexer 48 is provided to the output of the multiplexer 48. Thus, the rising edge signal is output from the multiplexer 48.

The enable signal Enable remains high while the test and characterization circuit 20 is in operation. Thus, the input 2 of the multiplexer 32 remains selected after the high Enable signal passes through the delay element 34 to the selection input of the multiplexer 32. The rising edge signal thus passes from the output of the multiplexer 48 to the multiplexer 32 and from the multiplexer 32 to the clock input Clock of the flip-flop 22.

When the clock input Clock of the flip-flop 22 again receives the rising edge signal from the multiplexer 32, the output Q of the multiplexer 22 again goes high, and the cycle repeats itself. Thus, a rising edge signal propagates through an oscillation path beginning at Q, passing through the multiplexer 29, through both the first group 26 and the second group 28 of logic cells, passing through the multiplexers 30, 48, and 32 until finally reaching the clock input Clock of the flip-flop 22. Before the rising edge signal arrives again at the clock input Clock, the output Q has already been reset to a low value via the delay element 38. When the rising edge signal arrives at Clock Q goes high again. In this manner, an oscillating signal is generated in a flip-flop type ring oscillator. Because the oscillation path includes both the first and second groups 26, 28 of logic cells 24, the frequency of the oscillating signal when Set Fall and Mode are low is based in part on the rising edge delay through the first and second groups 26, 28 of logic cells 24.

A control circuit, not pictured in FIG. 2, measures the frequency of the oscillating signal when Set Fall and Mode are low. The control circuit thus obtains the frequency and the period of the oscillating signal in the rising edge mode through the first and second groups 26, 28 of logic cells 24.

After measuring the frequency and period of the oscillating signal in the rising edge mode with the oscillation path including the first and second groups 26, 28 of logic cells 24, the control circuit causes the mode signal Mode to go high thereby selecting input 2 of the multiplexer 30. With input 2 of the multiplexer 30 selected, the oscillation path now includes only the first group 26 of logic cells 24.

With Mode at the high value and Set Fall at the low value, the test and characterization circuit 20 operates in substantially the same manner as described previously because the test and characterization circuit 20 is still in the rising edge mode. However, the flip-flop type ring oscillator has an oscillation path which includes fewer of logic cells 24. Particular, the oscillation path includes the logic cells 24 in only the first group 26. The multiplexer 30 now outputs the signal provided from the output of the logic cell M instead of the signal provided from the output of the logic cell N. Because the oscillation path includes fewer logic cells 24, the total rising edge delay caused by the logic cells 24 is reduced compared to the total rising edge delay caused by the logic cells 24 when both the first group 26 and the second group 28 are included in the oscillation path.

The control circuit measures the oscillation frequency and oscillation period with Mode high and Set Fall low. Because the only difference in the oscillation path is the elimination of the second group 28, the time difference in oscillation periods with Mode low and with Mode high corresponds to the rising edge delay due to solely to the second group 28 as can be seen more clearly in the following equation:

$$D_{28r} = T_{lowr} - T_{highr},$$

where $D_{28r}$ is the total rising edge signal delay through the group 28, $T_{lowr}$ is period of oscillation of a single cycle with Mode at the low value, and $T_{highr}$ is a period of oscillation of a single cycle with Mode at the high value.

The rising edge delay due to a single logic cell can be calculated by dividing the delay to the second group by the number of logic cells 24 in the second group:

$$D_{cellr} = D_{28r}/(N-M),$$

where $D_{cellr}$ is the rising edge delay through a single logic cell 24, N is the total number of logic cells 24 in both the first group 26 and the second group 28, and M is the number of logic cells 24 in the first group 26.

Operation of the test and characterization circuit 20 when calculating the falling edge delay will now be described. First, the control circuit sets Set Fall to the high value and Mode to the low value. Setting Set Fall to the high logic value corresponds to putting the flip-flop type ring oscillator into a mode in which the oscillation frequency is driven by a falling edge signal. Setting Mode to the low value causes the oscillation path to include both the first group 26 and the second group 28 of logic cells 24 as described previously.

The measurement begins by setting the enable signal Enable to the high value as described previously. This causes a rising edge signal to propagate from the multiplexer 32 to the input Clock of the flip-flop 22. When the rising edge signal is received at Clock, the output Q of the flip-flop 22 goes high. This causes a rising edge signal to propagate from Q to input 1 of the multiplexer 29. The rising edge signal also is received by the inverter 36. The inverter 36 inverts the signal from the output Q and outputs a falling edge signal to input 2 of the multiplexer 29. Because Set Fall is high, the multiplexer 29 outputs the falling edge signal from the input 2 to the input of the logic cell 1.

The logic cell 1 receives the falling edge signal and outputs the falling edge signal to the input of the logic cell 2. The logic cell 2 outputs the falling edge signal to the next logic cell and so on until the falling edge signal is received by the logic cell M and output to the logic cell M+1. The falling edge signal then propagates through the logic cells of the second group 28 until the falling edge signal is output from the logic cell N.

The falling edge signal is output from the logic cell N to input 1 of the multiplexer 30. Because Mode is at the low value, the falling edge signal received at input 1 is output from the multiplexer 30. Input 1 of the multiplexer 48 receives the falling edge signal from the output of the multiplexer 30. The inverter 42 also receives the falling edge signal from the multiplexer 30. The inverter 42 inverts the falling edge signal to a rising edge signal and provides it to input 2 of the multiplexer 48. Because Set Fall is at a high value, input 2 of the multiplexer 48 is selected. Thus, the multiplexer 48 outputs the rising edge signal received from the inverter 42.

Input 2 of the multiplexer 32 receives the rising edge signal from the multiplexer 48. Because Enable is high, and because the delay element 34 has already passed the high signal to the selection input of the multiplexer 32, the multiplexer 32 outputs the rising edge signal to the clock input Clock of the flip-flop 22.

As described previously in relation to the rising edge measurement, soon after Q goes high, the rising edge signal propagates through the delay element 38 to the input Reset of the flip-flop 22. This resets the flip-flop 22 causing the output Q to go low. Thus, when the rising edge signal again reaches the input Clock of the flip-flop 22, Q transitions from the low level to the high level and the cycle repeats itself. In this way, an oscillating signal is generated in the flip-flop type ring oscillator in which a falling edge signal is passed from the inverter 36 to the multiplexer 29 to the logic cells 24. Thus a falling edge signal propagates through the first group 26 and the second group 28 of the logic cells 24. The frequency of the oscillating signal depends in part on the falling edge delay through the logic cells of the first group 26 and the second group 28.

The control circuit measures the frequency of the oscillating signal when Set Fall is high and Mode is low. The control circuit thus obtains the frequency and the period of the oscillating signal in the falling edge mode through the first and second groups 26, 28 of logic cells 24.

After measuring the frequency and period of the oscillating signal in the falling edge mode with the oscillation path including the first and second groups 26, 28 of logic cells 24, the control circuit causes the mode signal Mode to go high thereby selecting input 2 of the multiplexer 30. With input 2 of the multiplexer 30 selected, the oscillation path now includes only the first group 26 of logic cells 24.

With Mode at the high value and Set Fall at the high value, the test and characterization circuit 20 operates in substantially the same manner as described previously because the test and characterization circuit 20 is still in the falling edge mode. However, the flip-flop type ring oscillator has an oscillation path which now includes fewer of the logic cells 24. In particular, the oscillation path includes the logic cells 24 of only the first group 26. The multiplexer 30 now outputs the signal provided from the output of the logic cell M instead of the signal provided from the output of the logic cell N. Because the oscillation path includes fewer logic cells 24, the total falling edge delay caused by the logic cells 24 is reduced compared to the total falling edge delay caused by the logic cells 24 when both the first group 26 and the second group 28 are included in the oscillation path.

The control circuit measures the oscillation frequency and oscillation period with Mode high and Set Fall high. Because the only difference in the oscillation path is the elimination of the second group 28, the time difference in oscillation periods with Mode low and with Mode high corresponds to the falling edge delay due solely to the second group 28 as can be seen more clearly in the following equation:

$$D_{28f} = T_{lowf} - T_{highf},$$

where $D_{28f}$ is the total falling edge signal delay through the group 28, $T_{lowf}$ is the period of oscillation of a single cycle with Mode at the low value, and $T_{highf}$ is the period of oscillation of a single cycle with Mode at the high value.

The falling edge delay due to a single logic cell can be calculated by dividing the delay due to the second group by the number of logic cells 24 in the second group:

$$D_{cellf} = D_{28f}/(N-M),$$

where $D_{cellf}$ is the falling edge delay through a single logic cell 24, N is the total number of logic cells 24 in both the first group 26 and the second group 28, and M is the number of logic cells 24 in the first group 26.

In one embodiment, the flip-flop 22 includes an output Q and an inverting output $\overline{Q}$ which outputs the logical opposite of Q. In this case, the inverter 36 is not present. Instead, input 1 of the multiplexer 29 is coupled to Q while input 2 of the multiplexer 29 is coupled to $\overline{Q}$. The delay element 38 is coupled between Reset and Q.

In one embodiment, the delay elements 34 and 38 include a string of buffers or other circuit components that can cause a delay in propagation from one end two the other. The delay elements 34 and 38 each cause a delay that is smaller than the time required for the rising edge signal from Q to arrive at Clock.

While FIG. 2 has disclosed a particular arrangement of a flip-flop, several multiplexers, delay elements, inverters, mode selection signals, etc. Those of skill the art will recognize in light of the present disclosure that many configurations of a flip-flop type ring oscillator are possible. All other such configurations fall from the scope of the present disclosure.

Figure 3:
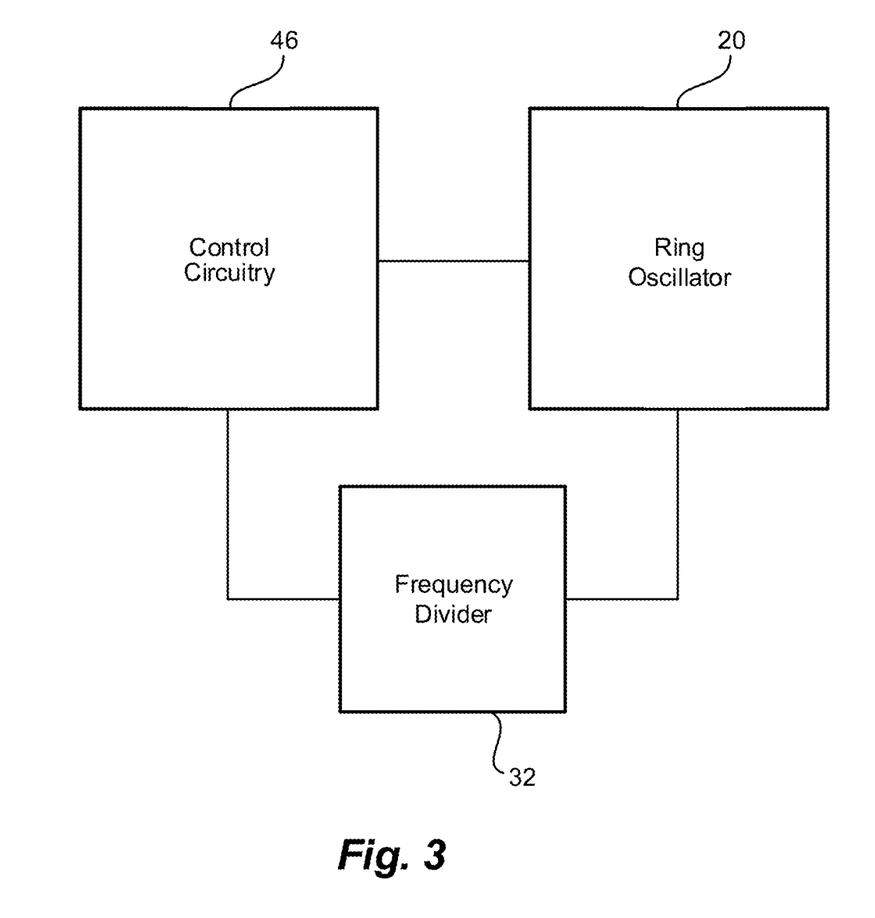
FIG. 3 is a block diagram of a logic cell test and characterization circuit according to one embodiment.

FIG. 3 is a block diagram of components for measuring the rising edge and falling edge delay of logic cells according to one embodiment. Control circuitry 46 is coupled to the flip-flop type ring oscillator test and characterization circuit 20. A frequency divider 32 is coupled between the ring oscillator 20 and the control circuitry 46.

The ring oscillator test and characterization circuit 20 generates oscillating signals as described previously in relation to FIG. 2. The control circuitry 46 provides the various control signals to the test and characterization circuit 20, such as Enable, Mode, Set Fall, etc. Each time the test and characterization circuit 20 generates an oscillating signal under the control of the control circuitry 46, the oscillating signal is passed to a frequency divider 32. The frequency divider 32 divides the frequency of the oscillating signal according to a division ratio. In this way, the frequency of the ring oscillator, which may be in the range of hundreds of megahertz or even gigahertz can be converted to a lower frequency signal via the frequency divider 32. The control circuitry 46 can measure the frequencies and periods of each of the four oscillating signals output from the frequency divider 32 and can calculate both the rising edge delay and the falling edge delay of a single logic cells 24 as described previously. The control circuitry 46 therefore knows the division ratio of the frequency divider 32 and may even control the division ratio the frequency divider 32. By knowing the division ratio, the control circuitry 46 can extrapolate the frequencies and periods of the oscillating signals generated by the ring oscillator 20. In this way, the control circuitry 46 can accurately measure the rising edge and falling edge delay of a single logic cell as described previously in relation to FIG. 2.

Figure 4A:
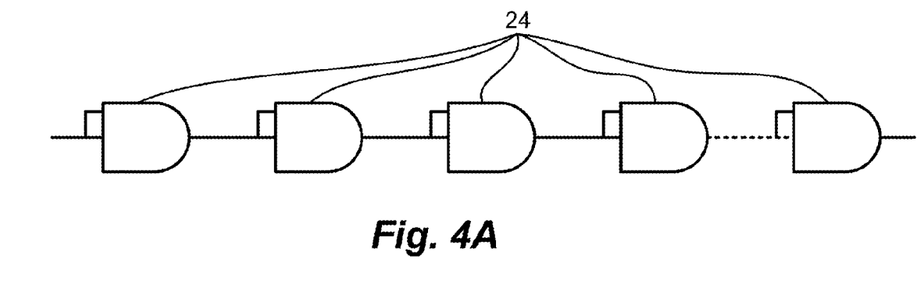
FIG. 4A is a schematic diagram of a chain of AND gate logic cells according to one embodiment.
Figure 4B:
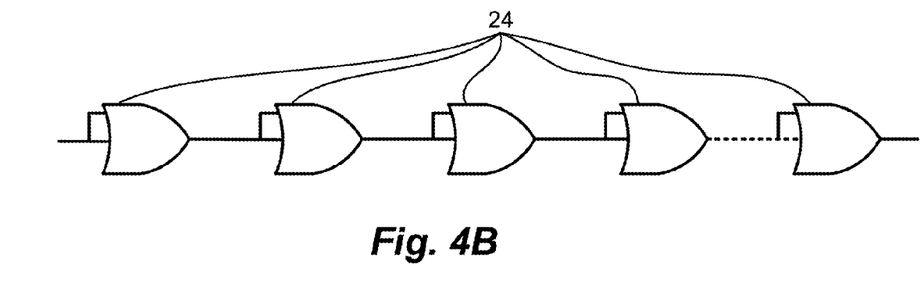
FIG. 4B is a schematic diagram of a chain of OR gate logic cells according to one embodiment.
Figure 4C:
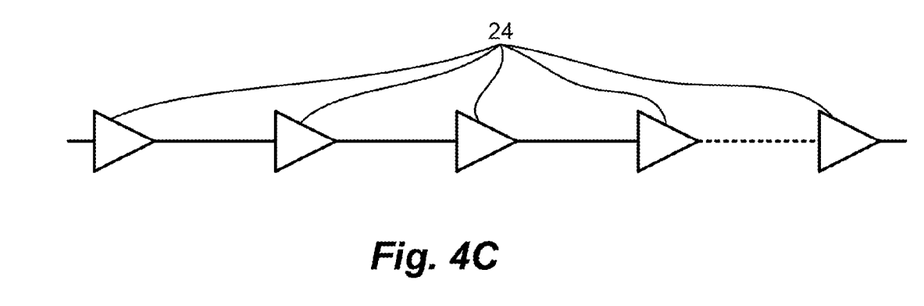
FIG. 4C is a schematic diagram of a chain of buffer logic cells according to one embodiment.

FIGS. 4A-4C disclose a plurality of logic cells 24 according to several embodiments. FIG. 4A discloses an embodiment in which each of the logic cells 24 is an AND gate. Each AND gate has its two inputs shorted together. The output of one AND gate is provided to the inputs of the next AND gate in the series. In this way, the AND Gates 24 form a chain as shown in FIG. 2 and can be divided into groups 26 and 28 as described previously. Thus, the test and characterization circuit 20 of FIG. 3 can be used to measure the propagation delay of both the rising edge and falling edge delay of a single AND gate as described previously in relation to FIG. 2.

FIG. 4B discloses an embodiment in which each of the logic cells 24 is an OR gate. Each OR gate has its two inputs shorted together. The output of one OR gate is provided to the inputs of the next OR gate in the series. In this way, the OR Gates 24 form a chain as shown in FIG. 2 and can be divided into groups 26 and 28 as described previously. Thus, the test and characterization circuit 20 of FIG. 3 can be used to measure the propagation delay of both the rising edge and falling edge delay of a single OR gate as described previously in relation to FIG. 2.

FIG. 4C discloses an embodiment in which each of the logic cells 24 is buffer. The output of one buffer is provided to the input of the next buffer in the series. In this way, the buffers 24 form a chain as shown in FIG. 2 and can be divided into groups 26 and 28 as described previously. Thus, the test and characterization circuit 20 of FIG. 3 can be used to measure the propagation delay of both the rising edge and falling edge delay of a single buffer as described previously in relation to FIG. 2.

While FIGS. 4A-4C have shown AND Gates, NOR Gates, and buffers, many other kinds of logic cells can be tested in accordance with principles of the present disclosure as will be apparent to those of skill the art in light of the present disclosure.

Figure 5:
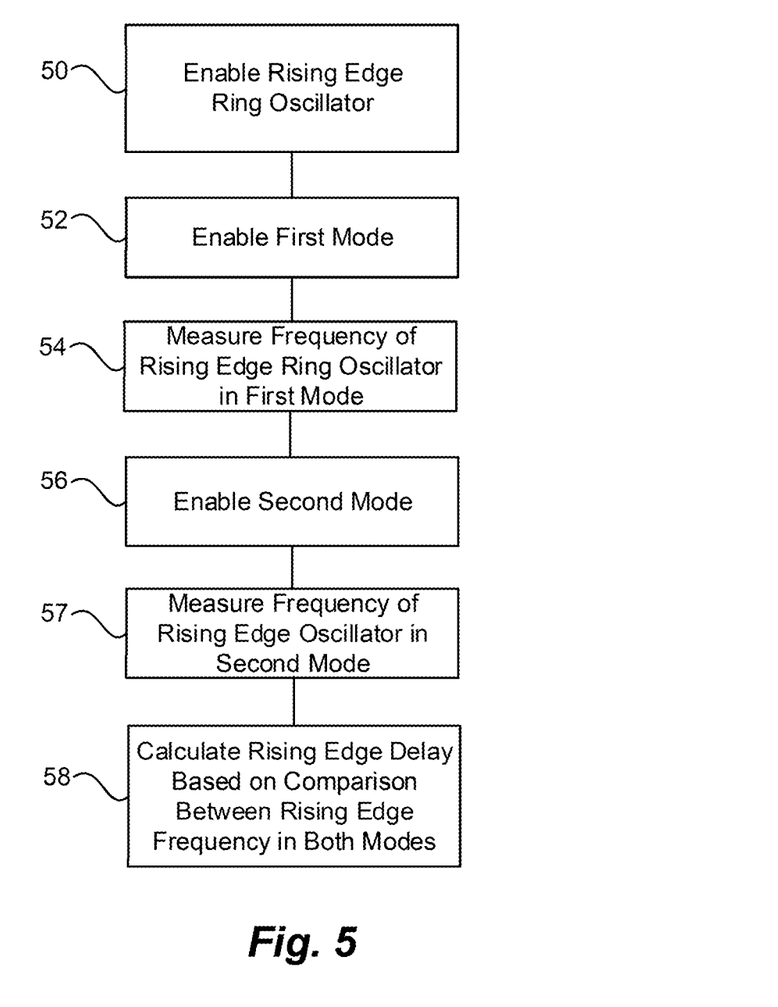
FIG. 5 is a flow diagram of a process for measuring the rising and falling edge delay of a logic cell according to one embodiment.

FIG. 5 is a flow diagram of a process for measuring the rising edge delay of a single logic cell according to one embodiment. At 50, the control circuit 46 enables the rising edge flip-flop type ring oscillator delay test and characterization circuit. At 52 the control circuit 46 enables the first mode of the ring oscillator delay test and characterization circuit 20 in which the oscillation path includes two groups of logic cells connected in series. At 54 the control circuit measures the frequency and/or the period of the rising edge ring oscillator test and characterization circuit 20 in the first mode. At 56 the control circuit 46 enables a second mode of the rising edge ring oscillator test and characterization circuit 20 in which the oscillation path includes only one of the two groups of logic cells. At 57 the control circuit measures the frequency of the rising edge oscillator test and characterization circuit in the second mode. At 58 the control circuit calculates the rising edge delay of a single logic cell based in part on a difference between the periods of oscillation of the first and second modes.

Figure 6:
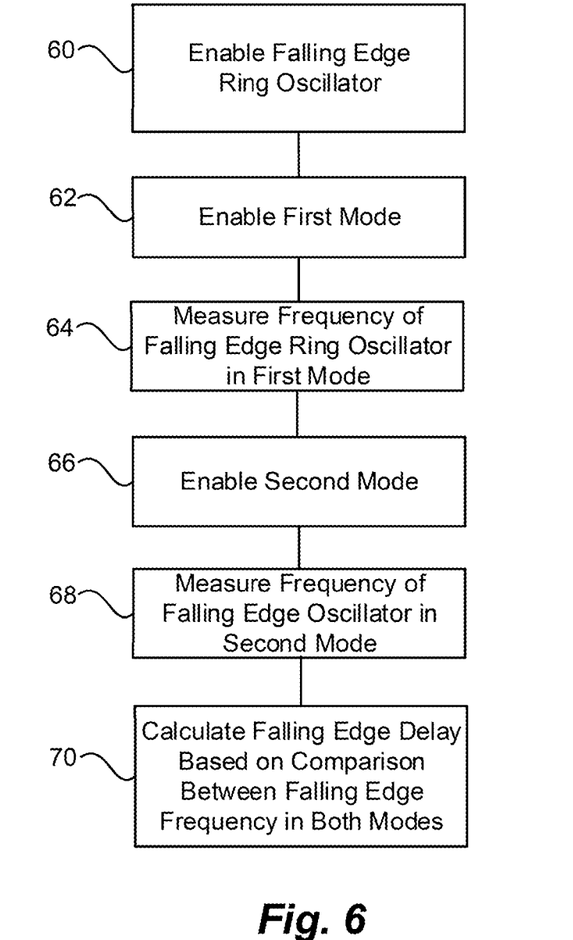
FIG. 6 is a flow diagram of a process for measuring the rising and falling edge delay of a logic cell according to one embodiment.

FIG. 6 is a flow diagram of a process for measuring the falling edge delay of a single logic cell according to one embodiment. At 60, the control circuit 46 enables the falling edge flip-flop type ring oscillator delay test and characterization circuit. At 62 the control circuit 46 enables the first mode of the falling edge ring oscillator delay test and characterization circuit 20 in which the oscillation path includes two groups of logic cells connected in series. At 64 the control circuit measures the frequency and/or the period of the falling edge ring oscillator test and characterization circuit 20 in the first mode. At 66 the control circuit 46 enables a second mode of the falling edge ring oscillator test and characterization circuit 20 in which the oscillation path includes only one of the two groups of logic cells. At 68 the control circuit measures the frequency of the falling edge oscillator test and characterization circuit in the second mode. At 70 the control circuit calculates the rising edge delay of a single logic cell based in part on a difference between the periods of oscillation of the first and second modes.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
    a flip-flop;
    a test device including:
        an input;
        a first output;
        a plurality of test cells connected in series between the input of the test device and the first output of the test device; and
        a second output;
        a subset of the plurality of test cells connected in series between and the input of the test device and the second output of the test device;
    a first circuit path coupled between an output of the flip-flop and the input of the test device;
    a second circuit path coupled between an input of the flip-flop and the first and second outputs of the test device, the second circuit path including a first multiplexor having:
        a first input coupled to the first output of the test device;
        a second input coupled to the second output of the test device;
        a control input that receives a mode control signal indicating a first mode or a second mode; and
        an output that supplies a signal from either the first or the second input of the first multiplexor based on the mode control signal; and a control circuit coupled to the test device that measures a first frequency of the first output of the test device when the first multiplexor is in the first mode and measures a second frequency of the second output of the test device when the first multiplexor is in the second mode;

wherein the control circuit calculates a delay of a single cell of the test cells based on a difference between the first and the second frequencies, and a difference in the number of the plurality of test cells for the first output and the number of test cells in the subset of the plurality of test cells for the second output.

2. The device of claim 1 wherein the control circuit measures a propagation delay in the test cells for either a rising or a falling edge based on an edge select control signal indicating selection of either a rising edge delay measurement or a falling edge delay measurement.

3. The device of claim 2, comprising a first signal delay path coupled between the output of the flip-flop and a reset input of the flip-flop.

4. The device of claim 2 wherein the second circuit path includes:
a second inverter having an input coupled to the output of the first multiplexor; and
a third multiplexor including:
a first input coupled to an output of the second inverter;
a second input coupled to the output of the first multiplexor; and
a control input that receives the mode select signal.

5. The device of claim 4 wherein the second circuit path comprises a fourth multiplexor including:
a first input coupled to the output of the third multiplexor;
a second input that receives an enable signal that enables flip-flop.

6. The device of claim 1 wherein the test cells are OR gates, AND gates, or buffers.

7. The device of claim 2 wherein the control circuit measures the rising edge and falling edge propagation delay based on a difference in oscillation periods of the first and second modes.

8. A device, comprising:
a flip-flop;
a test device including:
an input;
a first output;
a plurality of test cells connected in series between the input of the test device and the first output of the test device;
a second output between the first output of the test device and the input of the test device;
a first circuit path coupled between an output of the flip-flop and the input of the test device;
a second circuit path coupled between an input of the flip-lop and the first and second outputs of the test device, the second circuit path including a first multiplexor having:
a first input coupled to the first output of the test device;
a second input coupled to the second output of the test device;
a control input that receives a mode control signal indicating a first mode or a second mode; and
an output that supplies a signal from either the first or the second input of the first multiplexor based on the mode control signal;
a control circuit coupled to the test device, measures a first frequency of the first output of the test device when the multiplexor is in the first mode and measures a second frequency of the second output of the test device when the first multiplexor is in the second mode;
a first inverter having an input coupled to the output of the flip-flop; and
a second multiplexor including:
a first input coupled to the output of the flip-flop;
a second input coupled to an output of the first inverter;
a control input that receives an edge select control signal indicating selection of either a rising edge delay measurement or a falling edge delay measurement; and
an output coupled to the input of the test device and that supplies a signal from either the first or second input of the second multiplexor based on the edge select control signal.

9. A device, comprising:
a ring oscillator configured to generate an oscillation signal, the ring oscillator including:
a flip-flop configured to generate an output signal;
a plurality of test cells connected in series and coupled to the flip-flop in a ring oscillator configuration;
a first switch coupled to the plurality of test cells and configured to couple the plurality of test cells to an input of the flip-flop in a first mode and to couple a subset of the plurality of test cells to the input of the flip-flop in a second mode; and
a second switch coupled to the plurality of test cells and configured to supply the output signal to the plurality of test cells when the second switch is in a third mode and to supply an inverse of the output signal to the plurality of test cells when the second switch is in a fourth mode; and
a control circuit coupled to the ring oscillator and configured to:
calculate a rising edge delay of one or more of the test cells in the third mode based on oscillation signals in the first and second mode, and a difference in the number of the plurality of test cells and the number of test cells in the subset of the plurality of test cells; and
calculate a falling edge delay of one or more of the test cells in the fourth mode based on the oscillation signals in the first and second mode, and a difference in the number of the plurality of test cells and the number of test cells in the subset of the plurality of test cells.

10. The device of claim 9 wherein the first switch is a first multiplexor.

11. The device of claim 10 wherein the second switch is a second multiplexor.

12. The device of claim 11 wherein the test cells are selected from a group including OR gates, AND gates, XOR Gates, and buffers.

13. A method, comprising:
supplying an output signal of a flip-flop to a plurality of test cells connected in series and coupled to the flip-flop in a ring oscillator configuration;
generating a first oscillating signal from the plurality of test cells based on the output signal;
generating a second oscillating signal from a subset of the plurality of test cells based on the output signal;
supplying an inverse of the output signal to the plurality of test cells;
generating a third oscillating signal from the plurality of test cells based on the inverse of the output signal; and
generating a fourth oscillating signal from a subset of the plurality of test cells based on the inverse of the output signal
calculating a rising edge delay or falling edge delay of one or more of the test cells based on a difference in the number of test cells in the plurality of test cells and the number of test cells in the subset of the plurality of test cells, and a comparison between the first and second oscillating signals or between the third and fourth oscillating signals.

14. The method of claim 13, further comprising calculating the rising edge delay by dividing the difference in duration by a difference in a number of test cells in the plurality of test cells and the subset of the plurality of test cells.

15. A method, comprising:
supplying an output signal of a flip-flop to a plurality of test cells connected in series and coupled to the flip-flop in a ring oscillator configuration;
generating a first oscillating signal from the plurality of test cells based on the output signal;
generating a second oscillating signal from a subset of the plurality of test cells based on the output signal;
supplying an inverse of the output signal to the plurality of test cells;
generating a third oscillating signal from the plurality of test cells based on the inverse of the output signal;
generating a fourth oscillating signal from a subset of the plurality of test cells based on the inverse of the output signal;
calculating a rising edge delay of one or more of the test cells based in part on a comparison between the first and second oscillating signals;
generating a first divided oscillation signal by passing the first oscillation signal to a frequency divider;
generating a second divided oscillation signal by passing the second oscillation signal to the frequency divider; and
calculating the rising edge signal delay based on a comparison between the first and second divided oscillation signals.

* * * * *

UNITED STATES PATENT AND TRADEMARK OFFICE
CERTIFICATE OF CORRECTION

PATENT NO.         : 9,804,225 B2
APPLICATION NO.    : 14/472220
DATED              : October 31, 2017
INVENTOR(S)        : Saurabh Kumar Singh et al.

Page 1 of 1

It is certified that error appears in the above-identified patent and that said Letters Patent is hereby corrected as shown below:

In the Claims

Column 12, Line 52:
"between and the input of the test device and the second"
Should read:
--between the input of the test device and the second--.

Column 13, Line 54:
"flip-lop and the first and second outputs of the test"
Should read:
--flip-flop and the first and second outputs of the test--.

Signed and Sealed this
Ninth Day of July, 2019

Andrei Iancu
*Director of the United States Patent and Trademark Office*